United States Patent
Han et al.

(10) Patent No.: US 10,161,046 B2
(45) Date of Patent: Dec. 25, 2018

(54) METHOD FOR FORMING METAL PARTICLE LAYER AND LIGHT EMITTING DEVICE FABRICATED USING METAL PARTICLE LAYER FORMED BY THE METHOD

(71) Applicant: LG CHEM, LTD., Seoul (KR)

(72) Inventors: Hee Han, Daejeon (KR); Kyungjun Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 473 days.

(21) Appl. No.: 14/405,113

(22) PCT Filed: Jul. 22, 2013

(86) PCT No.: PCT/KR2013/006540
§ 371 (c)(1),
(2) Date: Dec. 2, 2014

(87) PCT Pub. No.: WO2014/017793
PCT Pub. Date: Jan. 30, 2014

(65) Prior Publication Data
US 2015/0249195 A1 Sep. 3, 2015

(30) Foreign Application Priority Data

Jul. 24, 2012 (KR) .................. 10-2012-0080457
Jul. 22, 2013 (KR) .................. 10-2013-0086065

(51) Int. Cl.
*C23C 18/48* (2006.01)
*H01L 33/40* (2010.01)
(Continued)

(52) U.S. Cl.
CPC ............ *C23C 18/48* (2013.01); *C23C 18/165* (2013.01); *C23C 18/44* (2013.01); *C23C 18/54* (2013.01);
(Continued)

(58) Field of Classification Search
CPC ............ H01L 51/0035; H01L 51/0545; H01L 51/0583; H01L 51/0595; H01L 51/50;
(Continued)

(56) References Cited

U.S. PATENT DOCUMENTS 7,678,607 B2 * 3/2010 Chiang .............. H01L 45/1633
257/4
7,704,789 B2 * 4/2010 Sun ..................... H01L 45/1633
257/4
(Continued)

FOREIGN PATENT DOCUMENTS

| CN | 1677703 A | 10/2005 |
|---|---|---|
| CN | 102214661 A | 10/2011 |

(Continued)

OTHER PUBLICATIONS

International Search Report issued in International Application No. PCT/KR2013/006540 dated Oct. 24, 2013, 2 pages.
(Continued)

*Primary Examiner* — Michael Jung
(74) *Attorney, Agent, or Firm* — Rothwell, Figg, Ernst & Manbeck, P.C.

(57) ABSTRACT

Disclosed is a method for forming a metal particle layer having irregular structures in a simpler manner. The method includes bringing a base into contact with an activation solution including a metal compound, an organic acid activator, and a complexing agent. The base is oxidized by the organic acid activator to produce electrons and the metal compound is reduced by the electrons to deposit metal particles on the surface of the base. Also disclosed is a method for fabricating a light emitting device with improved light extraction efficiency that uses a metal particle layer formed by the above method.

12 Claims, 4 Drawing Sheets

(51) Int. Cl.
*C23C 18/16* (2006.01)
*C23C 18/44* (2006.01)
*C23C 18/54* (2006.01)
*H01L 33/38* (2010.01)

(52) U.S. Cl.
CPC ............ *H01L 33/405* (2013.01); *H01L 33/38* (2013.01); *H01L 2933/0016* (2013.01); *H01L 2933/0091* (2013.01)

(58) Field of Classification Search
CPC ... H01L 2251/5369; H01L 2924/01029; H01L 21/288; H01L 21/76873; H01L 21/76874; H01L 24/03; H01L 2924/01006; H01L 2924/01013; H01L 2924/01046; H01L 2924/0105; H01L 2924/01051; H01L 2924/01073; H01L 2924/01074; H01L 2924/01078; H01L 2924/01079; H01L 31/18; H01L 33/405; H01L 33/38; C23C 18/48; C23C 18/54; C23C 18/165
USPC ......... 438/99, 104, 608, 648, 650, 678, 767, 438/773, 974
See application file for complete search history.

(56) References Cited

U.S. PATENT DOCUMENTS

| | | | |
|---|---|---|---|
| 7,776,196 B2 | 8/2010 | Fujimoto et al. | |
| 2002/0063062 A1* | 5/2002 | Hymes | H01L 21/6723 205/123 |
| 2008/0105560 A1 | 5/2008 | Tseng et al. | |
| 2008/0303034 A1 | 12/2008 | Huang et al. | |
| 2010/0137970 A1* | 6/2010 | Srivastava et al. | 623/1.15 |
| 2012/0058644 A1* | 3/2012 | Klipp | 438/707 |
| 2013/0131187 A1* | 5/2013 | Hashizume | C09C 1/62 514/770 |
| 2015/0068907 A1* | 3/2015 | Fujikawa et al. | 205/50 |

FOREIGN PATENT DOCUMENTS

| | | |
|---|---|---|
| KR | 10-2012-0014677 A | 2/2012 |
| KR | 10-1134191 B1 | 4/2012 |

OTHER PUBLICATIONS

Office Action issued for counterpart Chinese Patent Application No. 201380037834.3. dated Nov. 3, 2016, 6 pages.

* cited by examiner

METHOD FOR FORMING METAL PARTICLE LAYER AND LIGHT EMITTING DEVICE FABRICATED USING METAL PARTICLE LAYER FORMED BY THE METHOD

CROSS REFERENCE TO RELATED APPLICATIONS

This application is a 35 U.S.C. § 371 National Phase Entry Application from PCT/KR2013/006540, filed Jul. 22, 2013, and designating the United States, which claims priority under 35 U.S.C. § 119 to Korean Patent Application No. 10-2012-0080457 filed Jul. 24, 2012, and to Korean Patent Application No. 10-2013-0086065 filed Jul. 22, 2013, which are incorporated herein by reference in their entireties.

BACKGROUND OF THE INVENTION

1. Field of the Invention

The present invention relates to a method for forming a metal layer having irregular structures in a simpler manner and a method for fabricating a light emitting device with improved light extraction efficiency that uses a metal layer formed by the above method.

2. Description of the Related Art

Light emitting devices are semiconductor devices in which an electrical current is allowed to flow in the forward direction through a PN junction to generate light.

Light emitting devices using semiconductors convert electrical energy into light energy with high efficiency, have a service life as long as 5 to 10 years, and possess the advantages of low power consumption and greatly reduced maintenance and repair costs. Due to these advantages, light emitting devices have received attention for applications in next generation lighting devices.

Sapphire substrates are typically used for the growth of gallium nitride-based compound semiconductors in the fabrication of light emitting devices. A general low-power gallium nitride-based light emitting device is fabricated in such a manner that a sapphire substrate, on which a crystal structure has grown, is positioned on a lead frame and two electrodes are connected to each other on the top of the substrate. For the purpose of improving the heat dissipation efficiency of the device, the thickness of the sapphire substrate is reduced to about 80 microns or less before bonding to the lead frame. Considering that the thermal conductivity of the sapphire substrate is about 50 W/m•K, the sapphire substrate suffers from very high thermal resistance even when its thickness is reduced to about 80 microns, making it difficult to obtain desired heat dissipation characteristics.

Under such circumstances, flip-chip bonding is used to further improve the heat dissipation characteristics of high-power gallium nitride-based light emitting devices. Flip-chip bonding is a technique in which a chip with a light emitting diode structure is flip-bonded to a highly thermally conductive submount such as a silicon wafer (thermal conductivity ~150 W/m•K) or an AlN ceramic substrate (thermal conductivity ~180 W/m•K). In this case, heat is dissipated through the submount substrate. This heat dissipation improves the thermal dissipation efficiency compared to heat dissipation through a sapphire substrate. However, the improvement does not reach a satisfactory level and the fabrication process is complicated.

In order to solve such problems, recent attention has been directed toward sapphire substrate-free vertical LEDs. Vertical LEDs can be fabricated by removing a sapphire substrate from a light emitting structure using a laser lift-off (LLO) technique before packaging. The laser lift-off technique makes the fabrication process simpler than flip-chip bonding. Vertical LEDs are known as structures with the best heat dissipation efficiency.

The emission area of a LED fabricated by a flip-chip bonding technique is about 60% of the chip area, while that of a sapphire substrate-free vertical LED reaches 90% of the chip area. Accordingly, the sapphire substrate-free structure exhibits better characteristics.

Despite these advantages, however, the sapphire substrate-free vertical LED exhibits lower light extraction efficiency than conventional light emitting devices. The reason for this is as follows. The sapphire substrate-free LED structure is covered with a molding material such as epoxy or a molding material mixed with a phosphor. At this time, a large difference in refractive index between gallium nitride (GaN) and the molding material causes total reflection of a considerable portion of light from the LED structure without being emitted to the outside. The reflected light returns back to the light emitting structure and evanesces. Assuming that the refractive index of the molding material is about 1.5, the amount of total reflected light from the interface between the molding material and gallium nitride (refractive index ~2.6) is about 9%. Thus, further improvement in light extraction efficiency is needed.

To meet this need, research has been conducted on methods in which a sapphire substrate is removed and irregularities are formed on the exposed surface of a p-type gallium nitride layer before or after electrode wiring. For example, a technique using evanescent waves generated by total reflection is disclosed in Appl. Phys. Lett. 94, 091102 (2009). According to this technique, a ridge structure is allowed to grow on a V-grooved substrate to form a light emitting structure and constructive coupling of evanescent waves occurs depending on the design of the structure, achieving improved light extraction efficiency. However, further research is still needed to sufficiently improve the light extraction efficiency of light emitting devices.

SUMMARY OF THE INVENTION

The present invention has been made in view of the problems of the prior art, and it is an object of the present invention to provide a method for forming a metal layer having irregular structures in a simpler manner and a light emitting device with improved light extraction efficiency fabricated using a metal layer formed by the method.

The present invention provides a method for forming a metal particle layer, including bringing a base into contact with an activation solution including a metal compound, an organic acid activator, and a complexing agent wherein the base is oxidized by the organic acid activator to produce electrons and the metal compound is reduced by the electrons to deposit metal particles on the surface of the base.

In the present invention, the metal particle layer may have nanosized irregular structures.

In a preferred embodiment of the present invention, the irregularities may have a height of 10 to 1,000 nm.

In the present invention, the base may include at least one element selected from the group consisting of indium, tin, zinc, aluminum, gallium, antimony, iridium, ruthenium, nickel, silver, and gold.

In one embodiment of the present invention, the base may include at least one element or compound selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $IrO_x$, $RuO_x$, Ni, Ag, and Au.

In one embodiment of the present invention, the method may further include removing a metal oxide film formed when the base comes into contact with oxygen in air, before formation of the metal particle layer.

In the present invention, the metal particle layer may be formed by dipping the base in the activation solution once or more.

In the present invention, the metal compound may include at least one compound selected from the group consisting of metal salts, metal oxides, and metal hydrates including palladium, silver, gold, copper, gallium, titanium, tantalum, ruthenium, tin, platinum or an alloy thereof.

In one embodiment of the present invention, the concentration of the metal compound in the activation solution may be from 0.001 to 5 g/L.

In a preferred embodiment of the present invention, the organic acid activator may be an organic acid having 1 to 10 carbon atoms.

Specifically, the organic acid activator may include at least one organic acid selected from the group consisting of citric acid, oxalic acid, malonic acid, malic acid, tartaric acid, acetic acid, fumaric acid, lactic acid, formic acid, propionic acid, butyric acid, iminodiacetic acid, glyoxylic acid, and ascorbic acid.

In a preferred embodiment of the present invention, the organic acid activator may be an aliphatic polycarboxylic acid having 2 to 10 carbon atoms.

In the present invention, the complexing agent may include at least one compound selected from the group consisting of HCl, HF, and $NHF_3$.

In one embodiment of the present invention, the activation solution may further include an alkylene glycol monoalkyl ether.

The present invention also provides a device including a metal particle layer formed by the method wherein the metal particle layer is composed of metal particles deposited by the reduction of a metal compound.

According to one embodiment of the present invention, there is provided a light emitting device including a light emitting structure, an electrode layer, and a metal particle layer sequentially formed on a substrate wherein the metal particle layer is formed by the method and is composed of metal particles deposited by the reduction of a metal compound.

In one embodiment of the present invention, the light emitting structure may have a structure in which an n-type semiconductor layer, an active layer, and a p-type semiconductor layer are sequentially laminated.

In one embodiment of the present invention, the electrode layer may be formed using at least one element or compound selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $IrO_x$, $RuO_x$, Ni, Ag, and Au.

In one embodiment of the present invention, the light emitting device may be a low-power light emitting diode, a high-power flip type light emitting diode, a vertical light emitting diode, or an organic light emitting diode.

According to the method of the present invention, a metal particle layer having irregular structures can be formed in a simpler manner by bringing a metal compound into contact with an activation solution including an organic acid activator. By this wet processing, the metal compound is reduced to deposit metal particles. In addition, the light extraction efficiency of the light emitting device according to the present invention can be improved in a simpler manner by the use of the metal particle layer formed by the method.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Figure 1A:
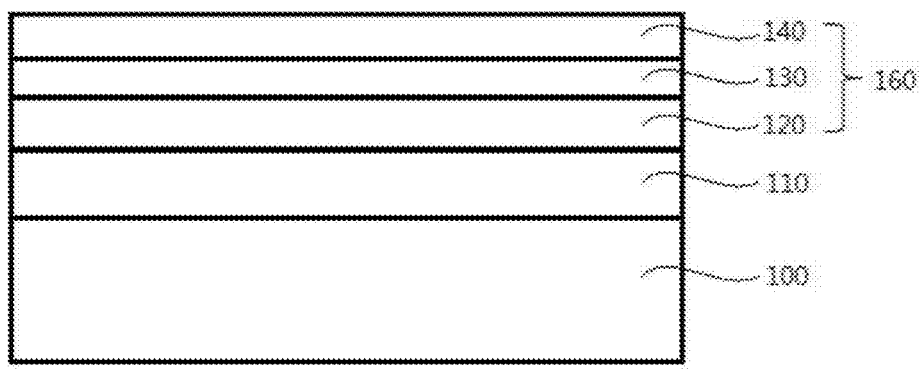
FIGS. 1a to 1c illustrate schematic cross-sectional views of structures formed in the course of fabricating a light emitting device according to one embodiment of the present invention.

The present invention will now be described in more detail with reference to the accompanying drawings.

Such terms as "first", "second," etc. may be used to describe various components. The above terms are used only to distinguish one component from another.

It will be understood that when an element or layer is referred to as being "on" another layer or element, it can be directly on the other layer or element, or one or more intervening layers or elements may be present therebetween or on an object or a base.

As the present invention allows for various changes and numerous embodiments, particular embodiments will be illustrated in drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention.

The present invention is directed to a method for forming a metal particle layer having irregular structures on a uniform nanometer scale by wet processing.

Specifically, the method of the present invention includes bringing a base into contact with an activation solution including a metal compound, an organic acid activator, and a complexing agent wherein the base is oxidized by the organic acid activator to produce electrons and the metal compound is reduced by the electrons to deposit metal particles on the surface of the base.

The method of the present invention employs a wet process by which metal nanoparticles can be deposited by the reduction of a metal salt to form a metal particle layer including nanosized irregular structures, rather than a physical/chemical etching process. According to the method of the present invention, problems such as structural damage encountered in physical/chemical etching can be solved.

In the present invention, a plurality of nanosized irregular structures is spontaneously formed in the metal particle layer because metal particles are deposited by the reduction of the metal compound. The size of the nanosized irregular structures corresponds to that of the deposited metal particles and may be from tens to thousands of nanometers. In one embodiment of the present invention, the metal particle layer may have irregular structures whose height is from about 10 to about 1,000 nm, preferably from about 30 to about 500 nm.

The height of the irregular structures may be controlled by varying the time or frequency of contact of the base with the activation solution. For example, the base may be dipped in the activation solution several times to increase the number of metal particles deposited, which leads to an increase in the height of the irregular structures.

In the present invention, the base may include at least one element selected from the group consisting of indium, tin, zinc, aluminum, gallium, antimony, iridium, ruthenium, nickel, silver, and gold. Preferably, the base includes a component that can be oxidized to produce electrons upon contact with the organic acid activator.

In one embodiment of the present invention, the base may be a transparent electrode of a light emitting device. In this embodiment, the base may include at least one element or compound selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrO$_x$, RuO$_x$, Ni, Ag, and Au. The base may include two or more components, for example, RuO$_x$/ITO, Ni/IrO$_x$/Au, or Ni/IrO$_x$/Au/ITO.

In one embodiment of the present invention, since the base includes an oxidizable component, a metal oxide film may be formed when the base comes into contact with oxygen in air before the metal particle layer is formed. Accordingly, it is preferred to remove the metal oxide film before formation of the metal particle layer.

As described above, the activation solution coming into contact with the base includes a metal compound, an organic acid activator, and a complexing agent.

The metal compound may include at least one compound selected from the group consisting of metal salts, metal oxides, and metal hydrates including palladium, silver, gold, copper, gallium, titanium, tantalum, ruthenium, tin, platinum or an alloy thereof.

The concentration of the metal compound in the activation solution may be from about 0.001 to about 5 g/L, preferably from about 0.001 to about 0.5 g/L. If the metal compound is present at a concentration of less than 0.001 g/L, the formation of metal nanoparticles may be impossible. Meanwhile, if the metal compound is present at a concentration exceeding 5 g/L, excessively large metal particles may be formed.

In the present invention, the activator is not an inorganic acid but an organic acid. The organic acid activator serves to promote the reduction of the metal compound.

The organic acid activator may be an organic acid having 1 to 10 carbon atoms. In comparison with an inorganic acid, the organic acid activator does not excessively etch the base while promoting the reduction of the metal compound, thus being advantageous in forming the nanostructured metal particle layer.

Specifically, the organic acid activator may include at least one organic acid selected from the group consisting of citric acid, oxalic acid, malonic acid, malic acid, tartaric acid, acetic acid, fumaric acid, lactic acid, formic acid, propionic acid, butyric acid, iminodiacetic acid, glyoxylic acid, and ascorbic acid.

In a preferred embodiment of the present invention, the organic acid activator may be an aliphatic polycarboxylic acid having 2 to 10 carbon atoms. More preferably, the organic acid activator contains 2 to 10 carboxyl groups.

The pH of the activation solution may be adjusted to 1 to 6 with the organic acid activator. Within this pH range, the formation of the metal particle layer may be easier. Particularly, the use of the aliphatic polycarboxylic acid having 2 to 10 carbon atoms is most preferred because it makes the irregular structures of the metal particle layer finer and more uniform.

The complexing agent serves to form ligands with metal ions of the metal compound. As the complexing agent, there may be used, for example, HF, NHF$_4$, or HCl. In one embodiment of the present invention, the use of hydrochloric acid (HCl) is preferred as the complexing agent when the metal compound is a metal chloride.

After the formation of ligands with metal ions of the metal compound, the complexing agent is replaced by the metal of the metal compound to deposit nanosized metal particles. For example, when palladium chloride is used as the metal compound and hydrochloric acid is used as the complexing agent, palladium particles may be deposited on the base surface to form a metal particle layer having irregular structures. This reaction is depicted in Scheme 1:

$$(PdCl_4)^{2-} + 2e^- \rightarrow Pd + 4Cl^- \qquad (1)$$

For better stability, the activation solution may further include an alkylene glycol monoalkyl ether. The alkylene glycol monoalkyl ether may be selected from the group consisting of, but not limited to, ethylene glycol monoethyl ether, ethylene glycol monobutyl ether, propylene glycol monomethyl ether, propylene glycol monoethyl ether, propylene glycol monobutyl ether, diethylene glycol monomethyl ether, diethylene glycol monoethyl ether, diethylene glycol monopropyl ether, diethylene glycol monobutyl ether, dipropylene glycol monomethyl ether, dipropylene glycol monoethyl ether, dipropylene glycol monopropyl ether, dipropylene glycol monobutyl ether, triethylene glycol monomethyl ether, triethylene glycol monoethyl ether, triethylene glycol monopropyl ether, triethylene glycol monobutyl ether, tripropylene glycol monomethyl ether, tripropylene glycol monoethyl ether, tripropylene glycol monopropyl ether, tripropylene glycol monobutyl ether, and mixtures thereof.

The method of the present invention can be applied to the fabrication of various devices, for example, light emitting devices, where nanosized irregular structures are required.

According to one embodiment of the present invention, there is provided a light emitting device including a light emitting structure, an electrode layer, and a metal particle layer sequentially formed on a substrate wherein the metal particle layer is formed by the method and is composed of metal particles deposited by the reduction of a metal compound.

A detailed explanation will be given concerning the light emitting device as an exemplary embodiment of the present invention. However, it should be understood that the scope of the present invention is not limited to this exemplary embodiment.

The light emitting device of the present invention may be fabricated by a method including forming a light emitting structure on a substrate, forming an electrode layer on the light emitting structure, and forming a metal particle layer on the electrode layer by wet processing.

The method employs a wet process by which metal nanoparticles are deposited by the reduction of a metal salt to form the metal particle layer having irregular structures on the electrode layer. Due to the irregular structures of the metal particle layer, total internal reflection of light emitted from the light emitting structure is minimized, ensuring enhanced light extraction efficiency of the light emitting device.

Figure 1B:
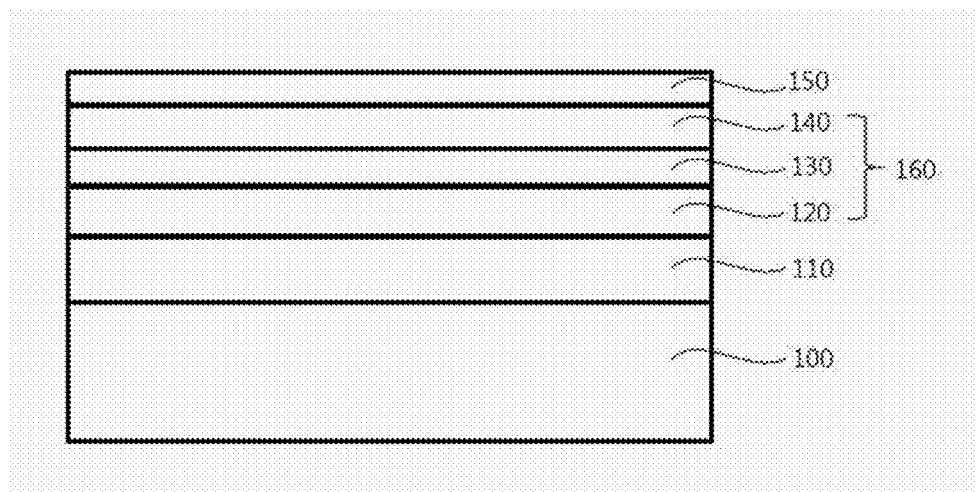
Figure 1C:
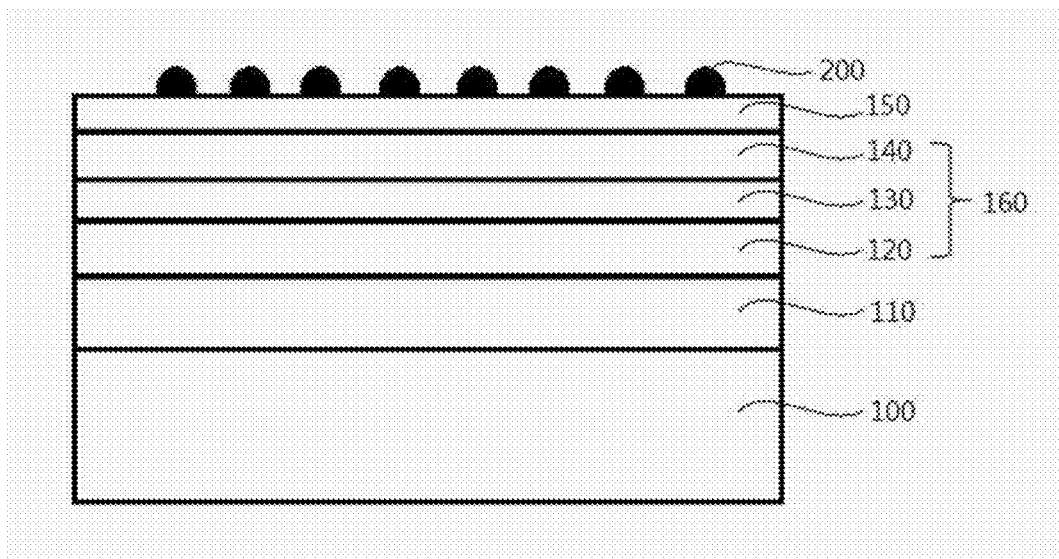

FIGS. 1a to 1c illustrate schematic cross-sectional views of structures formed in the course of fabricating a light emitting device according to one embodiment of the present invention.

Referring first to FIG. 1a, a light emitting structure 160 is formed on a substrate 100.

The substrate 100 may be made of, for example, at least one material of sapphire ($Al_2O_3$), silicon carbide (SiC), gallium nitride (GaN), zinc oxide (ZnO), and aluminum nitride (AlN). In a preferred embodiment of the present invention, the substrate 100 may be a sapphire substrate. Sapphire ($Al_2O_3$) is a single crystal form grown at 2,300° C. or more. Sapphire can be processed at high temperature due to its chemical and thermal stability and has the advantages of high binding energy and dielectric constant.

In one embodiment of the present invention, the light emitting structure 160 may be formed by allowing a plurality of nitride-based semiconductor layers to grow. Specifically, the light emitting structure 160 includes, for example, an n-type semiconductor layer 120, an active layer 130, and a p-type semiconductor layer 140. Electrons supplied from the n-type semiconductor layer 120 recombine with holes supplied from the p-type semiconductor layer 140 to produce light.

The light emitting structure 160 may be formed by a suitable method, for example, metal organic chemical vapor deposition (MOCVD), chemical vapor deposition (CVD), plasma-enhanced chemical vapor deposition (PECVD), molecular beam epitaxy (MBE), or hydride vapor phase epitaxy (HVPE). However, there is no restriction on the method for forming the light emitting structure 160. In a preferred embodiment of the present invention, the light emitting structure 160 may be formed by metal organic chemical vapor deposition.

Each of the n-type semiconductor layer 120 and the p-type semiconductor layer 140 may be formed of a gallium nitride-based semiconductor material represented by $Al_xGa_{(1-x)}N$ (where $0 \leq x \leq 1$). By varying the elemental composition of the gallium nitride-based compound, diodes capable of emitting light over a range of wavelengths can be freely fabricated.

The n-type semiconductor layer 120 supplies electrons to the active layer 130 and may be a GaN or GaN/AlGaN layer doped with an n-type conductive dopant. The n-type conductive dopant may be, for example, Si, Ge, or Sn. In one embodiment of the present invention, the n-type semiconductor layer 120 may be a GaN or GaN/AlGaN layer doped with Si.

As illustrated in FIGS. 1a to 1c, the n-type semiconductor layer 120 has a monolayer structure. However, there is no restriction on the structure of the n-type semiconductor layer 120. For example, the n-type semiconductor layer 120 may have a multilayer structure.

The active layer 130 is formed on the n-type semiconductor layer 130. The active layer 130 may be an InGaN/GaN layer having a multi-quantum well structure. Alternatively, the active layer 130 may have a single quantum well structure or a double heterostructure.

The p-type semiconductor layer 140 may be a GaN or GaN/AlGaN layer doped with a p-type conductive dopant. The p-type conductive dopant may be, for example, Mg, Zn, or Be. In one embodiment of the present invention, the p-type semiconductor layer 140 may be a GaN or GaN/AlGaN layer doped with Mg.

As illustrated in FIGS. 1a to 1c, the p-type semiconductor layer 140 has a monolayer structure. However, there is no restriction on the structure of the p-type semiconductor layer 140. For example, the p-type semiconductor layer 140 may have a multilayer structure. Thus, the light emitting structure 160 may include at least one junction structure selected from N-P junction, P-N junction, N-P-N junction, and P-N-P junction structures.

As illustrated in FIG. 1a, the light emitting device may further include a buffer layer 110 formed between the light emitting structure 160 and the substrate 100. The buffer layer 110 serves to moderate the difference in lattice constant between the light emitting structure 160 and the substrate 100. In one embodiment of the present invention, the buffer layer 110 may be an undoped GaN layer. The buffer layer 110 may also be excluded from the final device depending on the device characteristics and processing conditions.

In a further embodiment of the present invention, the light emitting structure 160 may be an organic light emitting diode (OLED) of top emission or bottom emission type.

An organic light emitting diode is a device in which when an electric field is applied to two electrodes interposing an organic layer, electrons and holes injected from the electrodes recombine with each other in the organic layer to create excitons, after which the excitons fall to the ground state to emit light. Organic light emitting diodes can be classified into various types according to their materials, emission mechanisms, emission directions, driving methods, etc. Organic light emitting diodes can be divided into bottom emission and top emission types according to their emission structures. In a bottom emission type organic light emitting diode, light is emitted toward a glass substrate. In a top emission type organic light emitting diode, light is emitted in an opposite direction to a glass substrate. For example, the method for fabricating the light emitting device of the present invention may be applied to the fabrication of a bottom emission type organic light emitting diode with improved light extraction efficiency.

As illustrated in FIG. 1b, an electrode layer 150 is formed on the light emitting structure 160.

The electrode layer 150 may be an electrically conductive transparent layer. For example, the electrode layer 150 may be formed of at least one element or compound selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $IrO_x$, $RuO_x$, $RuO_x$/ITO, Ni, Ag, Ni/$IrO_x$/Au, and Ni/$IrO_x$/Au/ITO. The electrode layer 150 may be formed into a monolayer or multilayer structure. In one embodiment of the present invention, the electrode layer 150 may be formed by a suitable method known in the art, such as e-beam evaporation or sputtering. However, there is no restriction on the method for forming the electrode layer 150.

The electrode layer 150 may come into contact with oxygen in air. In this case, a metal oxide film is spontaneously formed. It is thus necessary to remove the metal oxide film. The metal oxide film may be removed by dipping the substrate, on which the light emitting structure 160 and the electrode layer 150 are formed, in an organic acid solution.

In one embodiment of the present invention, the metal oxide film may be removed by dipping the resulting substrate in an organic acid solution including about 0.2 to about 20 wt % of an organic acid and deionized water for a time of about 30 seconds to about 10 minutes. Thereafter, the resulting substrate may be dipped in and washed with pure deionized water, and dried with nitrogen gas.

The kind of the organic acid may be identical to or different from that of an activator included in an activation solution used in the subsequent step. Examples of suitable organic acids include, but are not limited to, citric acid, oxalic acid, malonic acid, malic acid, tartaric acid, acetic acid, fumaric acid, lactic acid, formic acid, propionic acid, butyric acid, iminodiacetic acid, glyoxylic acid, and ascorbic acid.

Next, as illustrated in FIG. 1c, a metal particle layer 200 including nanosized irregular structures is formed on the electrode layer 150.

In the method for fabricating the light emitting device according to one embodiment of the present invention, the metal particle layer 200 serves to improve the light extraction efficiency of the light emitting structure 160. The formation of the irregularities is advantageous in improving the light extraction efficiency of the light emitting structure 160. To this end, the method of the present invention employs a wet process by which metal nanoparticles are deposited by the reduction of a metal salt to form the metal particle layer including nanosized irregular structures, rather than a physical or chemical etching process. According to the method of the present invention, problems such as structural damage encountered in physical/chemical etching can be solved.

More specifically, the substrate 100, on which the light emitting structure 160 and the electrode layer 150 are formed, is dipped in an activation solution including a metal compound, an organic acid activator, and a complexing agent to deposit metal particles on the electrode layer 150. The metal particle layer 200 thus formed includes nanosized irregular structures.

The metal compound may include at least one compound selected from the group consisting of, but not limited to, metal salts, metal chlorides, metal oxides, and metal hydrates including palladium, silver, gold, copper, gallium, titanium, tantalum, ruthenium, tin, platinum or an alloy thereof. In one embodiment of the present invention, the metal compound may be a metal chloride such as palladium chloride ($PdCl_2$).

The concentration of the metal compound in the activation solution may be from about 0.001 to about 5 g/L, preferably from about 0.001 to about 0.5 g/L. If the metal compound is present at a concentration of less than 0.001 g/L, the formation of metal nanoparticles may be impossible. Meanwhile, if the metal compound is present at a concentration exceeding 5 g/L, excessively large metal particles may be formed.

The organic acid activator plays a role in promoting the reduction of the metal compound. Another role of the organic acid activator is to finely etch the electrode layer 150, resulting in a reduction in total reflection. As the activator, there may be used an organic acid, for example, citric acid, oxalic acid, malonic acid, malic acid, tartaric acid, acetic acid, fumaric acid, lactic acid, formic acid, propionic acid, butyric acid, iminodiacetic acid, glyoxylic acid, ascorbic acid, or an aliphatic polycarboxylic acid.

In one embodiment of the present invention, an organic acid such as citric acid is preferably used as the activator to promote the reduction of the metal compound without excessively etching the electrode layer 150. The pH of the activation solution may be adjusted to 1 to 6 with the organic acid activator including an organic acid. Within this pH range, the formation of the metal particle layer 200 may be easier. When the activator includes an organic acid, particularly, a polycarboxylic acid such as citric acid, the irregular structures of the metal particle layer 200 may be finer and more uniform.

The complexing agent serves to form ligands with metal ions of the metal compound. As the complexing agent, there may be used, for example, HF, $NHF_4$, or HCl. In one embodiment of the present invention, the complexing agent may be hydrochloric acid (HCl).

After the formation of ligands with metal ions of the metal compound, the complexing agent is replaced by the metal of the metal compound to deposit nanosized metal particles on the surface of the electrode layer 150. For example, when palladium chloride is used as the metal compound and hydrochloric acid is used as the complexing agent, palladium particles may be deposited on the electrode layer 150 to form the metal particle layer 150 having irregular structures. This reaction is depicted in Scheme 1 above.

The metal particle layer 200 includes a plurality of nanosized irregular structures because it is formed from metal particles deposited by the reduction of the metal compound. The size of the nanosized irregular structures corresponds to that of the deposited metal particles and may be from tens to thousands of nanometers. In one embodiment of the present invention, the metal particle layer may have irregular structures whose height is from about 10 to about 1,000 nm, preferably from about 30 to about 500 nm.

If necessary, dipping of the resulting substrate in the activation solution to deposit metal nanoparticles on the electrode layer 150 may be repeated to increase the size of the irregular structures of the metal particle layer 200. The dipping frequency may be controlled to form the metal particle layer 200 having appropriately sized irregular structures.

Figure 2:
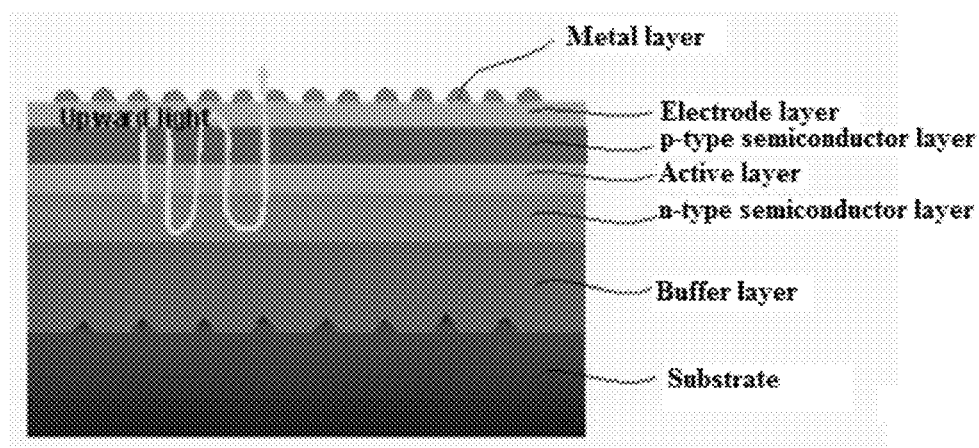
FIG. 2 illustrates a light path in a light emitting device including a metal particle layer having irregular structures on an electrode layer according to one embodiment of the present invention.

FIG. 2 illustrates a light path in the light emitting device including the metal particle layer having irregular structures on the electrode layer according to one embodiment of the present invention.

Referring to FIG. 2, the irregular structures composed of the nanosized metal particles formed on the electrode layer can achieve high refractive index. In addition, the light extraction efficiency of the light emitting device can be improved because the optical confinement center moves upward.

Therefore, the light emitting device of the present invention can greatly reduce the total reflection of light, achieving markedly improved light extraction efficiency, compared to a light emitting device including an electrode layer having a flat surface.

The light emitting device of the present invention, which includes the irregularly structured metal particle layer formed on the electrode layer, is applicable, without limitation, to low-power light emitting diodes, high-power flip type light emitting diodes, vertical light emitting diodes, organic light emitting diodes (OLEDs), and other light emitting devices.

After the formation of the irregularly structured metal particle layer on the electrode layer by wet processing, general methods known in the art can be carried out to fabricate various types of devices.

In one embodiment of the present invention, a laser lift-off technique may be used to remove the substrate 100. The exposed surface of the n-type semiconductor layer separated from the substrate 100 as a result of the laser lift-off technique is etched to form irregularities. Thereafter, a conductive material is deposited on the surface of the n-type semiconductor layer to form a plurality of n-type electrodes at constant intervals. At this time, trenches where the n-type electrodes are formed may be previously formed at constant intervals. Thereafter, the resulting structure is cut into individual LED chips by laser scribing or dicing followed by chip breaking. The LED chips can be used to manufacture light emitting diode devices.

The present invention will be explained in more detail with reference to the following examples. However, these examples are provided for illustrative purposes only and do not serve to limit the scope of the invention.

Example 1

A buffer layer 110 including GaN, an n-type semiconductor layer 120 including Si-doped GaN, an InGaN/GaN active layer 130, and a p-type semiconductor layer 140 including Mg-doped GaN were formed in this order on a sapphire ($Al_2O_3$) substrate 100 by metal organic chemical vapor deposition (MOCVD).

A 100 nm thick indium thin oxide (ITO) transparent electrode layer 150 was formed on the p-type semiconductor layer 140 by sputtering. The resulting structure was dipped in an aqueous solution containing 1 wt % of citric acid in deionized water for 3 min, again dipped in deionized water for 1 min, and dried with nitrogen ($N_2$) gas to remove an oxide film from the surface of the transparent electrode layer.

The resulting structure was dipped in an activation solution containing a mixture of 0.01 g/L of palladium chloride ($PdCl_2$), 10 g/L of citric acid, and 35 wt % of hydrochloric acid (HCl) for 10 min, and dipped twice in deionized water for 10 sec to form a metal particle layer including nanosized irregular structures on the transparent electrode layer.

Comparative Example 1

A metal particle layer was formed in the same manner as in Example 1, except that hydrofluoric acid (HF) was used instead of citric acid.

Experimental Tests

Figure 3:
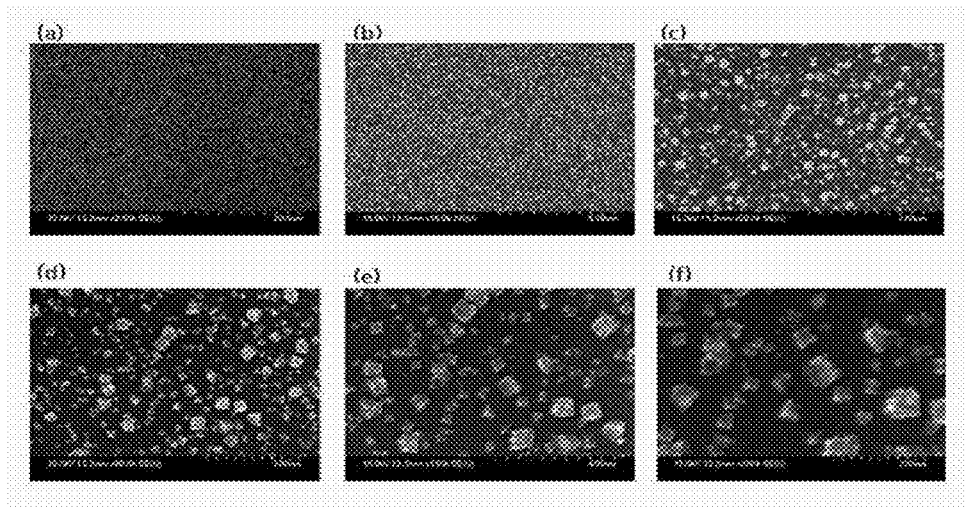
FIG. 3 shows the surface of a metal particle layer having irregular structures according to one embodiment of the present invention when observed with a scanning electron microscope (SEM) at different magnifications.

FIG. 3 shows the surface of the metal particle layer having irregular structures formed in Example 1 when observed with a scanning electron microscope (SEM) at different magnifications of (a) 2,500×, (b) 10,000×, (c) 50,000×, (d) 80,000×, (e) 130,000×, and (f) 200,000×. Referring to FIG. 3, it can be seen that the nanosized irregular structures were about 10-200 nm high.

Figure 4:
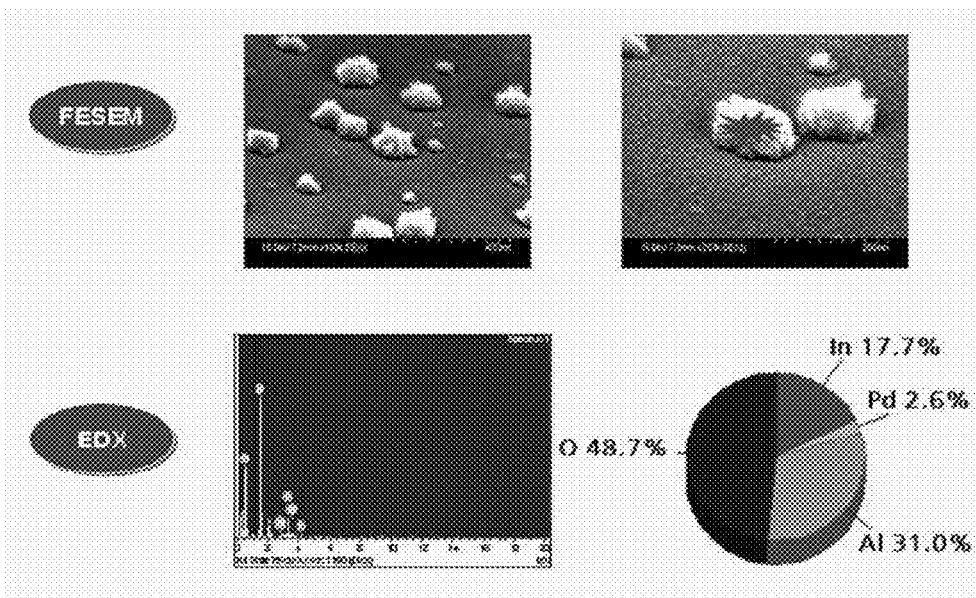
FIG. 4 shows the results observed by field emission scanning electron microscopy (FE-SEM), demonstrating the presence of Pd in a metal particle layer having irregular structures according to one embodiment of the present invention.

FIG. 4 shows the results of elemental analysis of the surface of the metal particle layer including irregular structures formed in Example 1 by field emission scanning electron microscopy (FE-SEM). FIG. 4 reveals the presence of Pd in the irregular structures.

Figure 5:
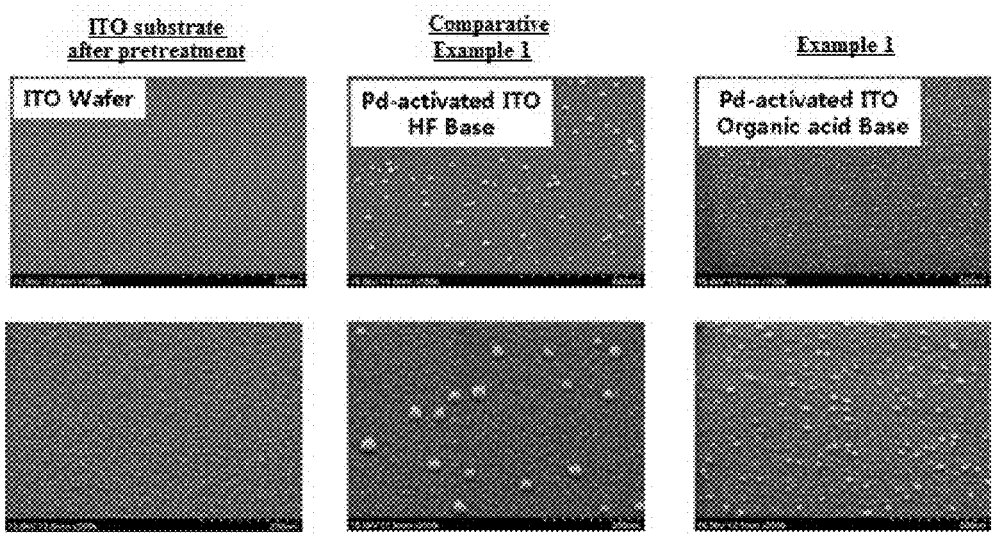
FIG. 5 shows SEM images of metal particle layers formed in Example 1 and Comparative Example 1.

FIG. 5 shows SEM images of the surface of the ITO substrate after pretreatment and the metal particle layers formed in Example 1 and Comparative Example 1. As can be seen from FIG. 5, the metal particle layer formed using the organic acid in Example 1 included smaller metal particles at a much higher density than that formed using the inorganic acid in Comparative Example 1. In Comparative Example 1, it was also observed that the surface of the ITO substrate was etched, and as a result, the formation of the Pd metal particles was not sufficient.

As apparent from the foregoing, according to the method of the present invention, uniform nanoparticles are deposited to form a metal particle layer. Therefore, when the metal particle layer is applied to a light emitting device, a 20% or more increase in light extraction efficiency can be expected. In addition, even when the light emitting device is operated with high power, a 5% or less reduction in efficiency can be expected.

EXPLANATION OF REFERENCE NUMERALS

100 Substrate
110 Buffer layer
120 n-type semiconductor layer
130 Active layer
140 p-type semiconductor layer
150 Electrode layer
160 Light emitting structure
200 Metal particle layer

What is claimed is:

1. A method for forming a metal particle layer, the method comprising:
    bringing a base into contact with an activation solution comprising a metal compound, an organic acid activator, and a complexing agent, wherein the base is oxidized by the organic acid activator to produce electrons and the metal compound is reduced by the electrons to deposit metal particles on a surface of the base, and
    removing a metal oxide film formed when the base comes into contact with oxygen in air, before formation of the metal particle layer by using an aqueous solution of the organic acid activator,
    wherein the activation solution further comprises an alkylene glycol monoalkyl ether.

2. The method according to claim 1, wherein the metal particle layer has nanosized irregular structures.

3. The method according to claim 2, wherein the irregularities have a height of 10 to 1,000 nm.

4. The method according to claim 1, wherein the base comprises at least one element selected from the group consisting of indium, tin, zinc, aluminum, gallium, antimony, iridium, ruthenium, nickel, silver, and gold.

5. The method according to claim 4, wherein the base comprises at least one element or compound selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $IrO_x$, $RuO_x$, Ni, Ag, and Au.

6. The method according to claim 1, wherein the metal particle layer is formed by dipping the base in the activation solution once or more.

7. The method according to claim 1, wherein the metal compound comprises at least one compound selected from the group consisting of metal salts, metal oxides, and metal hydrates comprising palladium, silver, gold, copper, gallium, titanium, tantalum, ruthenium, tin, platinum or an alloy thereof.

8. The method according to claim 1, wherein the concentration of the metal compound in the activation solution is from 0.001 to 5 g/L.

9. The method according to claim 1, wherein the organic acid activator is an organic acid having 1 to 10 carbon atoms.

10. The method according to claim 1, wherein the organic acid activator comprises at least one organic acid selected from the group consisting of citric acid, oxalic acid, malonic acid, malic acid, tartaric acid, acetic acid, fumaric acid, lactic acid, formic acid, propionic acid, butyric acid, iminodiacetic acid, glyoxylic acid, and ascorbic acid.

11. The method according to claim 1, wherein the organic acid activator is an aliphatic polycarboxylic acid having 2 to 10 carbon atoms.

12. The method according to claim 1, wherein the complexing agent comprises at least one compound selected from the group consisting of HCl, HF, and $NHF_3$.

* * * * *